(12) United States Patent
Pyeon et al.

(10) Patent No.: US 8,843,694 B2
(45) Date of Patent: Sep. 23, 2014

(54) SYSTEM AND METHOD OF PAGE BUFFER OPERATION FOR MEMORY DEVICES

(75) Inventors: Hong Beom Pyeon, Kanata (CA); Jin-Ki Kim, Kanata (CA); HakJune Oh, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 13/302,413

(22) Filed: Nov. 22, 2011

(65) Prior Publication Data

US 2012/0066442 A1 Mar. 15, 2012

Related U.S. Application Data

(63) Continuation of application No. 11/822,496, filed on Jul. 6, 2007, now Pat. No. 8,086,785.

(60) Provisional application No. 60/891,115, filed on Feb. 22, 2007.

(51) Int. Cl.
| | |
|---|---|
| *G06F 13/00* | (2006.01) |
| *G06F 13/28* | (2006.01) |
| *G11C 7/10* | (2006.01) |
| *G06F 12/08* | (2006.01) |

(52) U.S. Cl.
CPC ...... *G11C 7/1039* (2013.01); *G06F 2212/1044* (2013.01); *G11C 7/1087* (2013.01); *G08F 2212/3042* (2013.01); *G06F 2212/2022* (2013.01); *G06F 2212/7203* (2013.01); *G06F 12/0893* (2013.01); *G11C 7/106* (2013.01); *G11C 2207/2245* (2013.01)
USPC .............. 711/103; 711/118; 711/154; 710/52

(58) Field of Classification Search
USPC ............................ 711/103, 118, 154; 710/52
See application file for complete search history.

(56) References Cited

U.S. PATENT DOCUMENTS

| | | | |
|---|---|---|---|
| 2,264,395 | A | 12/1941 | Mitchel |
| 4,174,536 | A | 11/1979 | Misunas et al. |
| 4,617,566 | A | 10/1986 | Diamond |
| 4,733,376 | A | 3/1988 | Ogawa |
| 4,796,231 | A | 1/1989 | Pinkham |
| 4,899,316 | A | 2/1990 | Nagami |

(Continued)

FOREIGN PATENT DOCUMENTS

| | | |
|---|---|---|
| CN | 1314625 | 9/2001 |
| EP | 0952525 A1 | 10/1999 |

(Continued)

OTHER PUBLICATIONS

Samsung Electronics Co. LTD., 1G X 8 Bit/2G X 8 Bit NAND Flash Memory, K9F8GO8UXM, Technical Specification, 1-54, Mar. 31, 2007.

(Continued)

*Primary Examiner* — Edward Dudek, Jr.

(57) ABSTRACT

Systems and methods are provided for using page buffers of memory devices connected to a memory controller through a common bus. A page buffer of a memory device is used as a temporary cache for data which is written to the memory cells of the memory device. This can allow the memory controller to use memory devices as temporary caches so that the memory controller can free up space in its own memory.

29 Claims, 8 Drawing Sheets

(56) References Cited

U.S. PATENT DOCUMENTS

| | | |
|---|---|---|
| 5,038,299 A | 8/1991 | Maeda |
| 5,126,808 A | 6/1992 | Montalvo et al. |
| 5,132,635 A | 7/1992 | Kennedy |
| 5,136,292 A | 8/1992 | Ishida |
| 5,175,819 A | 12/1992 | Le Ngoc et al. |
| 5,204,669 A | 4/1993 | Dorfe et al. |
| 5,243,703 A | 9/1993 | Farmwald et al. |
| 5,249,270 A | 9/1993 | Stewart et al. |
| 5,280,539 A | 1/1994 | Yeom et al. |
| 5,319,598 A | 6/1994 | Aralis et al. |
| 5,365,484 A | 11/1994 | Cleveland et al. |
| 5,404,460 A | 4/1995 | Thomsen et al. |
| 5,430,859 A | 7/1995 | Norman et al. |
| 5,437,018 A | 7/1995 | Kobayashi et al. |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,535,357 A | 7/1996 | Moran et al. |
| 5,596,724 A | 1/1997 | Mullins et al. |
| 5,602,780 A | 2/1997 | Diem et al. |
| 5,636,342 A | 6/1997 | Jeffries |
| 5,671,178 A | 9/1997 | Park et al. |
| 5,721,840 A | 2/1998 | Soga |
| 5,729,683 A | 3/1998 | Le et al. |
| 5,740,379 A | 4/1998 | Hartwig |
| 5,761,146 A | 6/1998 | Yoo et al. |
| 5,771,199 A | 6/1998 | Lee |
| 5,802,006 A | 9/1998 | Ohta |
| 5,802,399 A | 9/1998 | Yumoto et al. |
| 5,806,070 A | 9/1998 | Norman et al. |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,860,080 A | 1/1999 | James et al. |
| 5,872,994 A | 2/1999 | Akiyama et al. |
| 5,937,425 A | 8/1999 | Ban |
| 5,941,974 A | 8/1999 | Babin |
| 5,959,930 A | 9/1999 | Sakurai |
| 5,995,417 A | 11/1999 | Chen et al. |
| 6,002,638 A | 12/1999 | John |
| 6,085,290 A | 7/2000 | Smith et al. |
| 6,091,660 A | 7/2000 | Sasaki et al. |
| 6,107,658 A | 8/2000 | Itoh et al. |
| 6,144,576 A | 11/2000 | Leddige et al. |
| 6,148,363 A | 11/2000 | Lofgren et al. |
| 6,148,364 A | 11/2000 | Srinivasan et al. |
| 6,178,135 B1 | 1/2001 | Kang |
| 6,208,556 B1 | 3/2001 | Akaogi et al. |
| 6,230,233 B1 | 5/2001 | Lofgren et al. |
| 6,295,618 B1 | 9/2001 | Keeth |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,438,064 B2 | 8/2002 | Ooishi |
| 6,442,098 B1 | 8/2002 | Kengeri |
| 6,442,644 B1 | 8/2002 | Gustavson et al. |
| 6,453,365 B1 | 9/2002 | Habot |
| 6,456,528 B1 | 9/2002 | Chen |
| 6,535,948 B1 | 3/2003 | Wheeler et al. |
| 6,564,285 B1 | 5/2003 | Mills et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,643,728 B1 | 11/2003 | Crutchfield et al. |
| 6,658,509 B1 | 12/2003 | Bonella et al. |
| 6,658,582 B1 | 12/2003 | Han |
| 6,680,904 B1 | 1/2004 | Kaplan et al. |
| 6,697,936 B2 | 2/2004 | Johnson |
| 6,715,044 B2 | 3/2004 | Lofgren et al. |
| 6,717,847 B2 | 4/2004 | Chen |
| 6,732,221 B2 | 5/2004 | Ban |
| 6,754,807 B1 | 6/2004 | Parthasarathy et al. |
| 6,763,426 B1 | 7/2004 | James et al. |
| 6,788,609 B2 | 9/2004 | Yamagami et al. |
| 6,799,235 B2 | 9/2004 | Bormann et al. |
| 6,807,103 B2 | 10/2004 | Cavaleri et al. |
| 6,807,106 B2 | 10/2004 | Gonzales et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,967,874 B2 | 11/2005 | Hosono |
| 6,978,402 B2 | 12/2005 | Hirabayashi |
| 6,988,154 B2 | 1/2006 | Latta |
| 6,996,644 B2 | 2/2006 | Schoch et al. |
| 7,031,221 B2 | 4/2006 | Mooney et al. |
| 7,032,039 B2 | 4/2006 | DeCaro |
| 7,062,601 B2 | 6/2006 | Becca et al. |
| 7,073,010 B2 | 7/2006 | Chen et al. |
| 7,073,022 B2 | 7/2006 | El-Batal et al. |
| 7,086,785 B1 | 8/2006 | Bates, III |
| 7,111,085 B2 | 9/2006 | Estakhri et al. |
| 7,111,140 B2 | 9/2006 | Estakhri et al. |
| 7,123,541 B2 | 10/2006 | Bell et al. |
| 7,130,958 B2 | 10/2006 | Chou et al. |
| 7,165,153 B2 | 1/2007 | Vogt |
| 7,190,617 B1 | 3/2007 | Harari et al. |
| 7,302,517 B2 | 11/2007 | Lim et al. |
| 7,308,524 B2 | 12/2007 | Grundy et al. |
| 7,356,639 B2 | 4/2008 | Perego et al. |
| 7,475,174 B2 | 1/2009 | Chow et al. |
| 7,496,777 B2 | 2/2009 | Kapil |
| 7,506,098 B2 | 3/2009 | Arcedera et al. |
| 7,515,471 B2 | 4/2009 | Oh et al. |
| 7,603,534 B2 | 10/2009 | Roohparvar |
| 7,631,162 B2 | 12/2009 | Gorobets |
| 7,650,459 B2 | 1/2010 | Eilert et al. |
| 7,652,922 B2 | 1/2010 | Kim et al. |
| 7,774,537 B2 * | 8/2010 | Pyeon et al. ............ 711/103 |
| 7,853,749 B2 | 12/2010 | Kolokowsky |
| 7,908,429 B2 * | 3/2011 | Pyeon et al. ............ 711/103 |
| 8,046,527 B2 * | 10/2011 | Pyeon et al. ............ 711/103 |
| 8,060,691 B2 * | 11/2011 | Pyeon et al. ............ 711/103 |
| 8,086,785 B2 * | 12/2011 | Pyeon et al. ............ 711/103 |
| 2001/0024386 A1 | 9/2001 | Harari et al. |
| 2001/0026487 A1 | 10/2001 | Koga |
| 2001/0045468 A1 | 11/2001 | Ikefuji |
| 2002/0124129 A1 * | 9/2002 | Zilberman ............ 711/103 |
| 2002/0161941 A1 | 10/2002 | Chue et al. |
| 2002/0188781 A1 | 12/2002 | Schoch et al. |
| 2003/0009612 A1 | 1/2003 | Latta |
| 2003/0074505 A1 | 4/2003 | Andreas et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0148482 A1 | 7/2004 | Grundy et al. |
| 2004/0199721 A1 | 10/2004 | Chen |
| 2004/0230738 A1 | 11/2004 | Lim et al. |
| 2004/0230743 A1 | 11/2004 | Ware et al. |
| 2004/0256638 A1 | 12/2004 | Perego et al. |
| 2005/0028057 A1 | 2/2005 | Briggs et al. |
| 2005/0120157 A1 | 6/2005 | Chen et al. |
| 2005/0120163 A1 | 6/2005 | Chou et al. |
| 2005/0160218 A1 | 7/2005 | See et al. |
| 2005/0166006 A1 | 7/2005 | Talbot et al. |
| 2005/0207232 A1 | 9/2005 | Delfs et al. |
| 2005/0213421 A1 | 9/2005 | Polizzi et al. |
| 2005/0286298 A1 | 12/2005 | Hyvonen et al. |
| 2005/0289313 A1 | 12/2005 | Roohparvar |
| 2006/0031593 A1 | 2/2006 | Sinclair |
| 2006/0050594 A1 | 3/2006 | Park |
| 2006/0198202 A1 * | 9/2006 | Erez ............ 365/185.29 |
| 2006/0224789 A1 | 10/2006 | Cho et al. |
| 2006/0271605 A1 | 11/2006 | Petruzzo |
| 2007/0050536 A1 | 3/2007 | Kolokowsky |

(56) References Cited

U.S. PATENT DOCUMENTS

| | | | |
|---|---|---|---|
| 2007/0076479 A1 | 4/2007 | Kim et al. | |
| 2007/0076502 A1 | 4/2007 | Pyeon et al. | |
| 2007/0083701 A1 | 4/2007 | Kapil | |
| 2007/0101096 A1 | 5/2007 | Gorobets | |
| 2007/0109833 A1 | 5/2007 | Pyeon et al. | |
| 2007/0153576 A1 | 7/2007 | Oh et al. | |
| 2007/0177436 A1 | 8/2007 | Davis et al. | |
| 2007/0233903 A1 | 10/2007 | Pyeon | |
| 2007/0233917 A1 | 10/2007 | Pyeon et al. | |
| 2007/0234071 A1 | 10/2007 | Pyeon | |
| 2007/0288686 A1 | 12/2007 | Arcedera et al. | |
| 2008/0016269 A1 | 1/2008 | Chow et al. | |
| 2008/0028176 A1 | 1/2008 | Bartley et al. | |
| 2008/0049505 A1 | 2/2008 | Kim et al. | |
| 2008/0052449 A1 | 2/2008 | Kim et al. | |
| 2008/0140899 A1 | 6/2008 | Oh et al. | |
| 2008/0155207 A1 | 6/2008 | Eilert et al. | |
| 2008/0205168 A1 | 8/2008 | Pyeon et al. | |
| 2010/0054069 A1* | 3/2010 | Shiota et al. | 365/220 |
| 2010/0275056 A1 | 10/2010 | Pyeon et al. | |
| 2011/0173381 A1* | 7/2011 | Lee et al. | 711/103 |
| 2011/0314206 A1* | 12/2011 | Pyeon et al. | 711/103 |

FOREIGN PATENT DOCUMENTS

| | | |
|---|---|---|
| GB | 2217056 | 10/1989 |
| JP | 04167039 | 6/1992 |
| JP | 07014392 | 1/1995 |
| JP | 10187549 | 7/1998 |
| JP | 2000315185 A | 11/2000 |
| WO | 2001069411 A2 | 9/2001 |
| WO | 2005069150 A1 | 7/2005 |
| WO | 2008098349 A1 | 8/2008 |

OTHER PUBLICATIONS

Spansion, "S7OGLO1GNO0 Mirrobit Flash 1024 Megabit, 3.0 Volt-Only Page Mode Flash Memory Featuring 110 NM Mirrorbit Process Technology", 1-83, Jun. 1, 2005.

8-Megabit 2.5 Volt Only or 2.7-Volt Only Data Flash, Technical Specification, Rev. 2225H-DFLSH-10/04, AT45DB081B, Oct. 2004, 1-33.

16 Mbit SPI Serial Flash, SST25VF016B, Preliminary Specification, Silicon Storage Technology Inc., Apr. 2005, 1-28.

Czarik, Damien, "European Search Report for European Patent 07800456.1" Jul. 7, 2009, 1-7, Jul. 1, 2009.

Inoue, Atsushi et al, NAND Flash Applications Design Guide, System Solutions From Toshiba America Electronic Components, Inc., Revision 1.0, 1-29, Apr. 1, 2003.

Choi, Young, 16-Gbit MLC NAND Flash Weighs in, EEETimes.com, http://www.eetimes.com/showArticle.jhtmlarticleID=201200825, 1-3, Jul. 30, 2007.

Samsung Electronics Co. Ltd., 2G x 8Bit NAND Flash Memory, K9GAGO8UXM; K9GAGO8U0M, , 1-48, Sep. 21, 2006.

Hara, T. et al, A 146-MM2 8-Gb Multi-Level NAND Flash Memory With 70-NM CMOS Technology, IEEE Journal of Solid State Circuits, vol. 41, No. 1, Jan. 2006, 161-169.

Toshiba, 16 Gbit (2G x 8Bit) CMOS NAND E2PROM (Multi-Level-Cell), TC58NVG4D1DTGOO, 1-64, Nov. 9, 2006.

Samsung Electronics Co. Ltd 1G x 8 Bit/2G x 8 Bit/ 4G x 8 Bit Nand Flash Memory, K9XXGO8UXA, 1-50, Jul. 18, 2006.

Samsung Electronics Co. Ltd., 256 M x 8 Bit/ 128M x 16 Bit/512M x 8 Bit NAND Flash Memory, K9K4G08U1M, K9F2G08U0M, K9F2G16U0M, Revision 1.0, 1-41, May 6, 2005.

"2Gbit (256 X 8 Bits) CMOS NAND E2PROM", TH58NVG1S3AFT05, Toshiba MOS Digital Integrated Circuit Silicon Gate CMOS, 1-32, May 19, 2003.

Samsung Electronics Co. Ltd 512M x 8 Bit/ 1G x 8 Bit NAND Flash Memory, K9XXG08UXA, 1-43, Mar. 7, 2006.

64 Megabit CMOS 3.0 Volt Flash Memory With 50MHZ SPI (Serial Peripheral Interface) Bus Data Sheet (Preliminary) Publication No. S25FL064A, 1-32, Sep. 6, 2006.

Jung, T. et al, A 117-MM2 3.3-V Only 128-Mb Multilevel NAND Flash Memory for Mass Storage Applications, IEEE Journal of Solid-State Circuits, vol. 31, No. 11, 1575-1583, Nov. 1, 1996.

Kim, J. et al, A 120-MM2 64-Mb NAND Flash Memory Archieving 180 NS/Byte Effective Program Speed, IEEE Journal of Solid-State Circuits, vol. 32, No. 5, 670-680, May 1, 1997.

Imamiya, K et al, A 125-MM2 1-Gb NAND Flash Memory With 10-Mbyte/S Program Speed, IEEE Journal of Solid-State Circuits, vol. 37, No. 11, 1493-1501, Nov. 1, 2002.

Hara, T. et al, A 146MM2 8GB NAND Flash Memory With 70NM CMOS Technology, ISSCC Session 2 Non-Volatile Memory 2.1, IEEE International Solid-State Circuits Conference, 44-45-584, Feb. 7, 2005.

Kennedy, Joseph et al, "A 2Gb/S Point to Point Heterogeneous Voltage Capagle DRAM Interface for Capacity-Scalable Memory Subsystems" ISSCC 2004/ Session 1/ DRAM/ 11.8, IEEE International Solid-State Circuits Conference, 1-10, Feb. 15, 2004.

Shirota, R. et al, A 2.3 UM2 Memory Cell Structure for 16Mb NAND EEPROMS, International Electron Devices Meeting 1990, Technical Digest; Dec. 1990, 103-106.

Suh, K. et al, A 3.3 V 32 Mb NAND Flash Memory With Incremental Step Pulse Programming Scheme, IEEE Journal of Solid-State Circuits, Vol. 30, No. 11, 1149-1156, Nov. 1, 1995.

Lee, S. et al, A 3.3V 4Gb Four-Level NAND Flash Memory With 90NM CMOS Technology, ISSCC 2004/Session 2Non-Volatile Memory/2.7, IEEE International Solid-State Circuits Conference, Digest of Technical Papers, vol. 1, XPO10722148, ISBN: 0-7803-8267-6, 1-10, Feb. 16, 2004.

Ohtsuka, N. et al, A 4-Mbit CMOS EPROM, IEEE Journal of Solid-State Circuits, vol. 22, Issue 5, Oct. 1, 1987.

Momodomi, M. et al, A 4Mb NAND EEPROM With Tight Programmed VT Distribution, IEEE Journal of Solid-State Circuits, vol. 26, Issue 4, 492-496, Apr. 1, 1991.

Takeuchi, K. et al, A 56NM CMOS 99MM2 8Gb Multi-Level NAND Flash Memory With 10Mb/S Program Throughput,Solid-State Circuits, 2006 IEEE International Conference Digest of Technical Papers, Seesion 7, ISBN:1-4244-0079-1, 10 pages, Feb. 6, 2006.

Tomita, N. et al, A 62-NS 16 Mb CMOS EPROMM With Voltage Stress Relaxation Technique, IEEE Journal of Solid-State Circuits vol. 26, No. 11, 1593-1599, Nov. 1, 1991.

Lee, June et al, A 90-NM CMOS 1.8-V 2-Gb NAND Flash Memory for Mass Storage Applications, IEEE Journal of Solid-State Circuits, vol. 38, No. 11, 1934-1942, Nov. 1, 2003.

Cho, T. et al, A Dual-Mode NAND Flash Memory: 1Gb Multilevel and High Performance 512-Mb Single-Level Modes, IEEE Journal of Solid-State Circuits, vol. 36, No. 11, 1700-1706, Nov. 1, 2001.

Tanzawa, T. et al, A Dynamic Analysis of Dickson Charge Pump Circuit, IEEE J. Solid-State Circuits, vol. 32, No. 8, 1231-1240, Aug. 1, 1997.

Takeuchi, K. et al, A Multipage Cell Architecture for High-Speed Programming Multilevel NAND Flash Memories, IEEE Journal of Solid-State Circuits, vol. 33, Issue 8, Aug. 1998, 1228-1238.

Kirisawa, R. et al, A NAND Structured Cell With a New Programming Technology for Highly Reliable 5V-Only Flash EEPROM, 1990 Symposium on VLSI Technology, CH 2874-6, 90/0000-0129 1990 IEEE, Honolulu, US, 129-130, Jun. 4, 1990.

Saito, S. et al, A Programmable 80NS 1Mb CMOS EPROM, IEEE ISSCC Digest of Technical Papers, 176-177-340, Feb. 14, 1985.

Tanaka, T. et al, A Quick Intelligent Page-Programming Architecture and Shielded Bitline Sensing Method for 3 V-Only NAND Flash Memory, IEEE Journal of Solid-State Circuits, vol. 29, Issue 11, 1366-1373, Nov. 1, 1994.

Gjessing, S. et al, A RAM Link for High Speed, Special Report/ Memory, IEEE Spectrum, 52-53, Oct. 1, 1992.

Aritome, S. et al, A Reliable Bi-Polarity Write/Erase Technology in Flash EEPROMS, Intl. Electron Devices Meeting, Technical Digest, 111-114, Dec. 9, 1990.

Gal, E. et al, "Algorithms and Data Structures for Flash Memories", ACM Computing Surveys (CSUR), vol. 37, No. 2; Jun. 2005, 138-163.

Byeon, D. et al, An 8Gb Multi-Level NAND Flash Memory With 63NM STI CMOS Process Technology, IEEE International Solid-State Circuits Conference, 46-47, Feb. 7, 2005.

(56) References Cited

OTHER PUBLICATIONS

Tanzawa, T. et al, Circuit Techniques for a 1.8-V-Only NAND Flash Memory, IEEE Journal of Solid-State Circuits, vol. 37, No. 1, 84-89, Jan. 1, 2002.

King, Craig, L. et al, Communicating With Daisy Chained MCP42XXX Digital Potentiometers Microchip AN747, 1-8, Jan. 30, 2001.

"DDR2 Fully Buffered DIMM 240 PIN FBDIMMS Based on 512 Mb C-DIE" (Rohs Compliant) Rev. 1.3, 1-32, Sep. 1, 2006.

M-Systems Flash Disk Pioneers Ltd., "Diskonchip H1 4Gb (512 Mbyte) and 8 Gb (1 Gbyte) High Capacity Flash Disk With NAND and x2 Technology" Data Sheet, Rev. 0.5 (Preliminary), 1-66, Jan. 1, 2005.

Tal, Arie, "Guidelines for Integrating Diskonchip in a Host System" Application Note, AP-DOC-1004, Rev. 1.0, 1-15, Aug. 1, 2004.

Lee, June et al, High-Perfomance 1-Gb NAND Flash Memory With .012-•m Technology, IEEE Journal of Solid-State Circuits, vol. 37, No. 11, 1502-1509, Nov. 1, 2002.

Oshima, Y. et al, High-Speed Memory Architectures for Multimedia Applications—Meeting the Requirements of Higher Performance, Circuits and Devices, IEEE 8755-3996/97, 8-13, Jan. 1, 1997.

High Speed Small Sectored SPI Flash Memory 4M (524,288.8) AT25FS040 Advance Information, 1-23, Sep. 1, 2006.

Hypertransport TM I/O Link Specification, Revision 2.00b, Document No. HTC20031217-0036-0010, Hyperstransport Technology Consortium, 1-325, Apr. 27, 2005.

Hypertransport TM 10 Link Specification, Revision 3.00, Document No. HTC20051222-0046-0008, Hyperstransport Technology Consortium, 1-428, Apr. 21, 2006.

Intel Advanced Boot Block Flash Memory (C3), 28F800C, 28F160C3, 28F320C3(16) Datasheet Product Features Order No. 290645, Revision: 023, 1-72, May 1, 2005.

Ziaie, Kazem, "International Patent Application No. PCT/CA2007/001428, Search Report", 1-2, Dec. 6, 2007.

Tung, Thomas KC, "International Patent Application No. PCT/CA20081000219, Search Report" , 1-2, May 8, 2008.

Ziaie, Kazem, "International Patent Application No. PCT/US2008/000250, Search Report", 49-50, Jun. 10, 2008.

Samsung Electronics, "Onenand 4G (KFW4G16Q2M-DEB6), Onenand 2G (KFH2G16Q2M-DEB6, Onenand 1G (KFW1G16Q2M-DEB6)" Flash Memory, OnenandTM Specification Ver. 1.2, 1-125, Dec. 23, 2005.

Gjessing, Stein, Performance of the RAMlink Memory Architecture, Proceedings of the Twenty-Seventh Annual Hawaii International Conference on System Sciences, IEEE 1060-3425/94, 154-162, Jan. 1, 1994.

Gjessing, Stein et al, RAMlink: A High-Bandwidth Point-To-Point Memory Architecture, Proceedings Compcom 1992, IEEE 0-8186-2655-0-92, 328-331, Feb. 24, 1992.

Diamond, Steven L., Synclink: High-Speed DRAM for the Future, Micro Standards, IEEE Micro, 74-75, Dec. 1, 1996.

"K9XXG08UXM Preliminary Flash Memory" Technical Specification, 1-43, May 3, 2005.

"2 Mbit Low Voltage Serial Flash Memory With 40MHZ SPI Bus Interface", 1-40, Aug. 1, 2004.

Kim, Jae-Kwan et al, "A 3.6Gb/S/PIN Simultaneous Bidirectional (SBD) I/O Interface for High-Speed DRAM" ISSCC 2004/Session 22/DSL and Multi-Gb/s I/O 22.7, IEEE International Solid-State Circuits Conference, 1-8, Feb. 15, 2004.

IEEE Standard for High-Bandwidth Memory Interface Based on Scalable Coherent Interface (SCI) Signaling Technology (RAMlink), IEEE Std. 1596.4-1996, The Institute of Electrical Electronics Engineers, Inc., 1-98, Mar. 19, 1996.

Atmel, "High Speed Small Sectored SPI Flash Memory 4M (524,288.8) AT25FS040 Advance Information", 1-23, Sep. 1, 2006.

\* cited by examiner

SYSTEM AND METHOD OF PAGE BUFFER OPERATION FOR MEMORY DEVICES

CROSS-REFERENCE TO RELATED APPLICATIONS

This application is a continuation of U.S. patent application Ser. No. 11/822,496 filed Jul. 6, 2007, which claims the benefit of prior U.S. Provisional Patent Application No. 60/891,115 filed on Feb. 22, 2007, the disclosures of which are hereby incorporated by reference in their entirety.

FIELD OF THE INVENTION

The present invention relates generally to memory systems. More particularly, the present invention relates to an apparatus and a method for controlling a plurality of memory devices.

BACKGROUND OF THE INVENTION

Electronic equipment uses memory devices, for example, flash memories, for storing data or information. In a memory system, a memory controller programs a selected flash memory device by loading data to a page buffer of the selected flash memory device.

United States Patent Application No. 2006/0198202 A1 published Sep. 7, 2006 discloses a flash memory system including a flash controller for controlling operation of multiple flash memory devices. One page buffer allocated within one flash device functions as a designated target buffer. Another page buffer allocated within another flash device functions as a mirror buffer. The flash controller transmits the page data to the two flash devices simultaneously and the same data is stored in the two page buffers. Thus, no data backup is required to be kept in the flash controller.

SUMMARY OF THE INVENTION

According to a broad aspect of the invention, there is provided a method for controlling a memory device connected with a controller, the device having a page buffer and memory cells, the controller having a data storage, the method comprising: writing data from the data storage of the controller to the page buffer of the device; and reading back the data at a later time from the page buffer of the device to the data storage of the controller, before programming the data from the page buffer into the memory cells of the device.

In some embodiments, a data load command and data are provided to the memory device which is enabled. In response to a command strobe, the data is transmitted from the data storage of the controller to the device, the page buffer of which stores the transmitted data. Before the stored data in the page buffer of the device is programmed into the memory cells of the device, the data is read back at a later time from the page buffer to the data storage of the controller.

Advantageously, the space in the data storage where the data is occupied may be freed up, upon writing the data from the data storage of the controller to the page buffer of the designated device.

According to another broad aspect of the invention, there is provided a method for controlling a plurality of devices connected with a controller through a common bus, each of the devices having a page buffer and memory cells, the controller having a data storage, the method comprising: writing data from the data storage of the controller to the page buffer of a designated device; and reading back the data at a later time from the page buffer of the designated device to the data storage of the controller, before programming the data from the page buffer into the memory cells of the designated device.

According to another broad aspect of the invention, there is provided an apparatus for controlling a plurality of devices connected with a common bus, each of the devices having a page buffer and memory cells, the apparatus having a data storage, the apparatus being capable of: writing data from the data storage to the page buffer of a designated device; and reading back the data at a later time from the page buffer of the designated device to the data storage, before programming the data from the page buffer into the memory cells of the designated device.

According to another broad aspect of the invention, there is provided a system comprising: a plurality of devices connected with a common bus, each of the devices having a page buffer and memory cells; and a memory controller for controlling the plurality of devices, the memory controller being capable of: writing data from a data storage of the controller to the page buffer of a designated device; and reading back the data at a later time from the page buffer of the designated device to the data storage of the controller, before programming the data from the page buffer into the memory cells of the designated device.

In some embodiments, each of the plurality of devices comprises flash memory devices.

BRIEF DESCRIPTION OF THE DRAWINGS

Embodiments will now be described with reference to the attached drawings in which.

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

In a memory system including, for example, flash memory devices, a read command to a flash memory device results in data being read from the flash memory cells to the page buffer and then transferred out of the page buffer. A write command to a flash memory device results in data being written to a page buffer, and then transferred from the page buffer to the flash memory cells. In some embodiments, this is achieved using some of the commands disclosed in U.S. Provisional Patent Application No. 60/839,329 "NAND Flash Memory Device" filed Aug. 22, 2006, which is hereby incorporated by reference in its entirety. U.S. Provisional Patent Application No. 60/892,705 "Modular Command Structure in Memory System and its Use" filed Mar. 2, 2007, which is hereby incorporated by reference in its entirety, discloses different command structures to distinguish core access operations that involve relatively long processing times from page buffer access operations that involve relatively short access times. The commands are "modular" because they allow separate access to the memory core and the page buffer. The core access commands and peripheral circuit including page buffer access commands are divided in the command definition. This allows for a "modular command system" enabling new uses for the page buffer of memory devices by accessing the page buffer independent of the program operation. This allows the page buffer to be used as a temporary cache for data.

For the purpose of allowing the page buffers to operate as temporary cache, for example, three "modular" memory devices access commands are used. The first is referred to as a "burst data load" command. This causes data to be written to the page buffer, but it is not then transferred to the flash memory cells. In the examples that follow, '4Xh' and '5Xh' are used for this, but more generally the command structure is defined on an implementation specific basis. The second is referred to as a "burst data read" command. This causes data to be read directly from the page buffer without first reading from the flash memory cells. In the examples that follow, '2Xh' is used for this, but more generally the command structure is defined on an implementation specific basis. The third is referred to as a "page program" command. This causes data that was previously stored in the page buffer to be written to the flash memory, destroying the contents of the page buffer in the process for verification purposes. In the examples that follow, '6Xh' is used for this, but more generally the command structure is defined on an implementation specific basis. Further details of example commands are provided in Table 1.

TABLE 1

| Command | OP Code (1 Byte) | Row Address (3 Bytes) | Column Address (2 Bytes) | Input Data (1 to 2112 Bytes) |
| --- | --- | --- | --- | --- |
| Page Read | 0Xh | Valid | — | — |
| Page Read for Copy | 1Xh | Valid | — | — |
| Burst Data Read | 2Xh | — | Valid | — |
| Burst Data Load Start | 4Xh | — | Valid | Valid |
| Burst Data Load | 5Xh | — | Valid | Valid |
| Page Program | 6Xh | Valid | — | — |
| Block Erase Address Input | 8Xh | Valid | — | — |
| Page-pair Erase Address Input | 9Xh | Valid | — | — |
| Erase | AXh | — | — | — |
| Operation Abort | CXh | — | — | — |
| Read Device Status | D0h | — | — | — |

TABLE 1-continued

| Command | OP Code (1 Byte) | Row Address (3 Bytes) | Column Address (2 Bytes) | Input Data (1 to 2112 Bytes) |
| --- | --- | --- | --- | --- |
| Read Device Information Register | F1h | — | — | — |
| Read Link Configuration Register | FEh | — | — | — |
| Write Link Configuration Register | FFh | — | — | Valid (1 Byte Only) |

Table I shows an example command set for flash memory with modular command in byte mode. Table 1 includes 14 commands: Page Read, Page Read for Copy, Burst Data Read, Burst Data Load Start, Burst Data Load, Page Program, Block Erase Address Input, Page-pair Erase Address Input, Erase, Operation Abort, Read Device Status, Read Device Information Register, Read Link Configuration Register, and Write Link Configuration Register. Each command has an Operation (OP) Code (1 Byte), a Row Address (3 Bytes), a Column Address (2 Bytes), and Input Data (1 to 2112 Bytes). In Table 1, 'X' is '0h' for "Bank 0". 'X' is '1h' for "Bank 1", for identifying the bank of a multiple bank memory.

Figure 1:
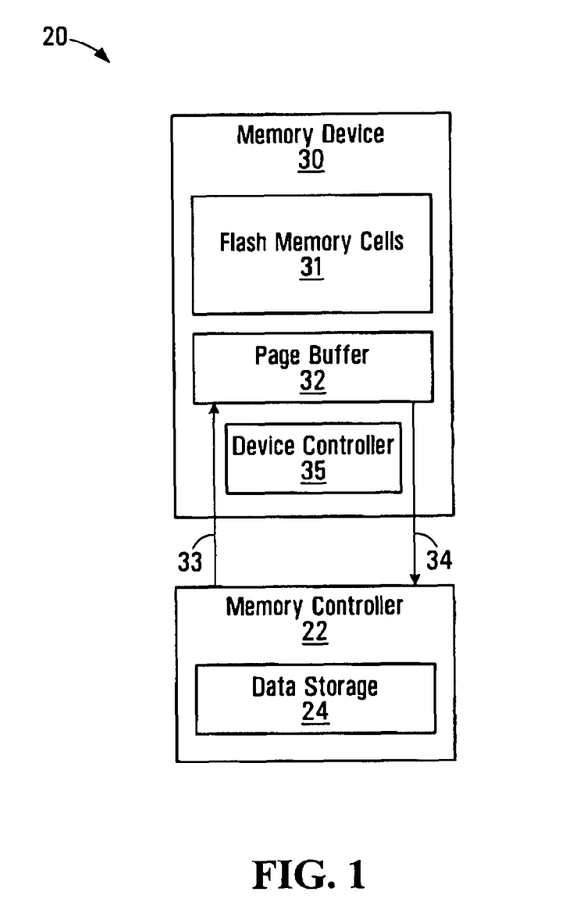
FIG. 1 is a block diagram of a memory system according to an embodiment of the present invention.

FIG. 1 shows a memory system 20 according to an embodiment of the present invention. Referring to FIG. 1, the memory system 20 includes a memory controller 22 and a memory device 30 having a page buffer 32 that is used as a temporary cache for page read or other operations using cache function. The memory controller 22 has a data storage 24. The memory device 30 includes flash memory cells 31, the page buffer 32 and a device controller 35. The page buffer 32 is used as a temporary cache. The device controller 35 includes any appropriate circuitry for facilitating processing of commands issued by the memory controller 22.

In operation, the memory controller 22 can transmit data to the page buffer 32 without restriction to page programming. Data from the data storage 24 of the memory controller 22 is written to the page buffer 32 by a burst data load command ('4Xh' or '5Xh') as indicated at 33, and subsequently read by a burst data read command ('2Xh') as indicated at 34. Note that page programming is not performed. Therefore, the page buffer 32 can be accessed relatively quickly. In this manner, the page buffer 32 can be used as a temporary cache for data.

Figure 2:
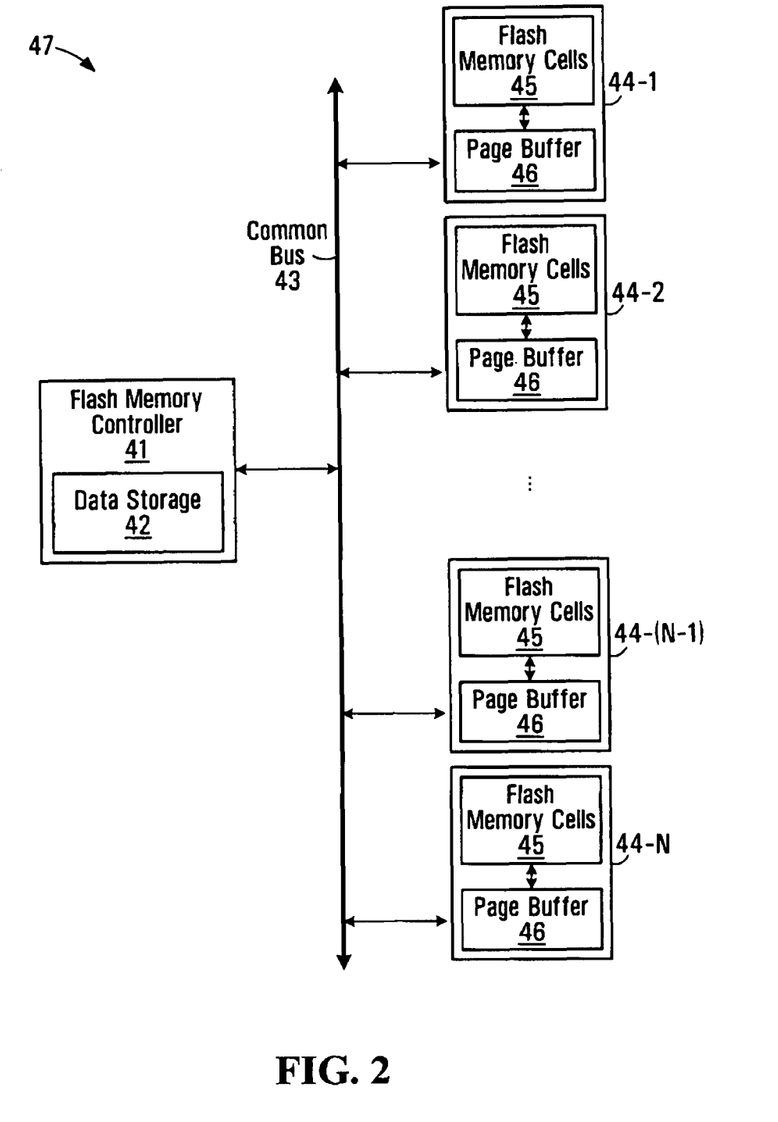
FIG. 2 is a block diagram of an example memory system having a multi-drop architecture to which embodiments of the present invention are applicable.

FIG. 2 shows an example memory system 47 having a multi-drop architecture. Referring to FIG. 2, the memory system 47 has a flash memory controller 41 and a plurality (N) of memory devices 44-1, 44-2, - - - , 44-(N−1) and 44-N connected via a common bus 43. N is an integer greater than one. The flash memory controller 41 has a data storage 42, which is, for example, an SRAM or any type of embedded memory. Each of the memory devices 44-1, 44-2, - - - , 44-(N−1) and 44-N has flash memory cells 45 and a page buffer 46.

Further details of how a page buffer can be used as a temporary cache for data are provided below.

An example command to send data from memory controller to a selected device without it automatically being written to the flash memory cells is "Burst Data Load ('4Xh' or '5Xh')". Using this command, any data that is to be held for some time while any operations based on flash commands are being executed in different devices can be transmitted to a selected device or devices. By this operation, the memory controller does not need to have several duplicated data storage elements to enhance the read and program performances.

Examples are provided below for memory systems having a multi-drop architecture such as the memory system 47 shown in FIG. 2.

Figure 3:
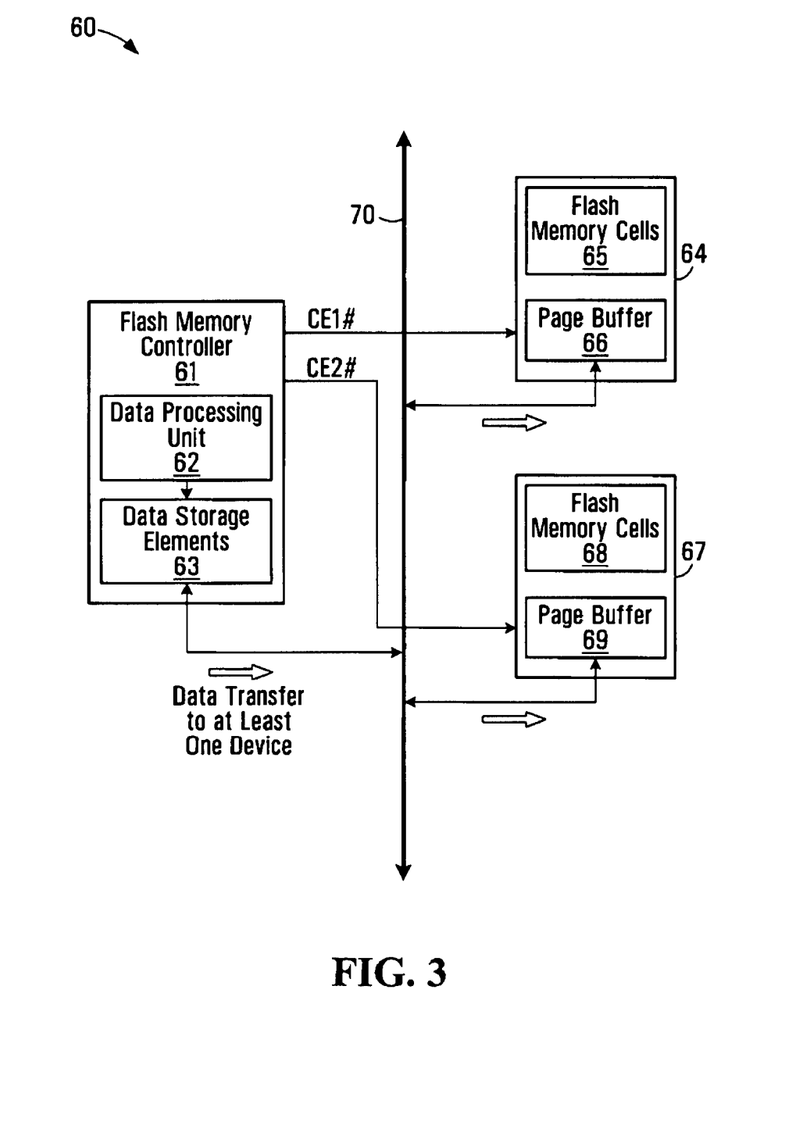
FIG. 3 is a block diagram of an example memory system having a multi-drop architecture in which a temporary cache function is performed.

FIG. 3 shows an example memory system 60 having a multi-drop architecture in which a temporary cache function is performed. In the particular example shown in FIG. 3, the memory system 60 includes a flash memory controller 61 and two memory devices 64 and 67. More generally, the number of memory devices is implementation specific. The flash memory controller 61 interconnects with the memory devices 64 and 67 via a common bus 70. The flash memory controller 61 has a data processing unit 62 and data storage elements 63. The memory device 64 has flash memory cells 65 and a page buffer 66. Similarly, the memory device 67 has flash memory cells 68 and a page buffer 69. In the memory system 60, a temporary cache function is performed.

In operation, the flash memory controller 61 transmits data from the data storage elements 63 to the page buffer of at least one designated device, which in the illustrated example happens to be the page buffers 66 and 69 of the memory devices 64 and 67, respectively. In this example, the data transmission is via a "Burst Data Load ('4Xh' or '5Xh')". Without additional command assertion to the flash memory devices 64 and 67 after the 'Burst Data Load' command, the page buffers 66 and 69 hold the data in latches. After transmitting the data to the designated devices 64 and 67, the flash memory controller 61 switches the contents of the data storage elements 63 in order to start a new operation, for example, a page program or a page read. At a later time, the data can be read from the page buffers 66 and 69 without programming the data into the memory cells 65 and 68 of the memory devices 64 and 67. The command "Burst Data Read ('2Xh')" is used for this purpose. The data processing unit 62 operates to perform the data processing for the memory controller 61. Subsequent examples also refer to a "data processing unit". It is to be understood that each data processing unit would include any appropriate circuitry for performing the data processing described for the example.

There are two cases where data is transmitted from the flash memory controller 61 to the two memory devices 64 and 67. A first case is that different data is transmitted to the memory devices. A second case is that the same data is transmitted to the memory devices 64 and 67. The data transfers of the first and second cases are shown in FIGS. 4A and 4B, respectively.

Figure 4A:
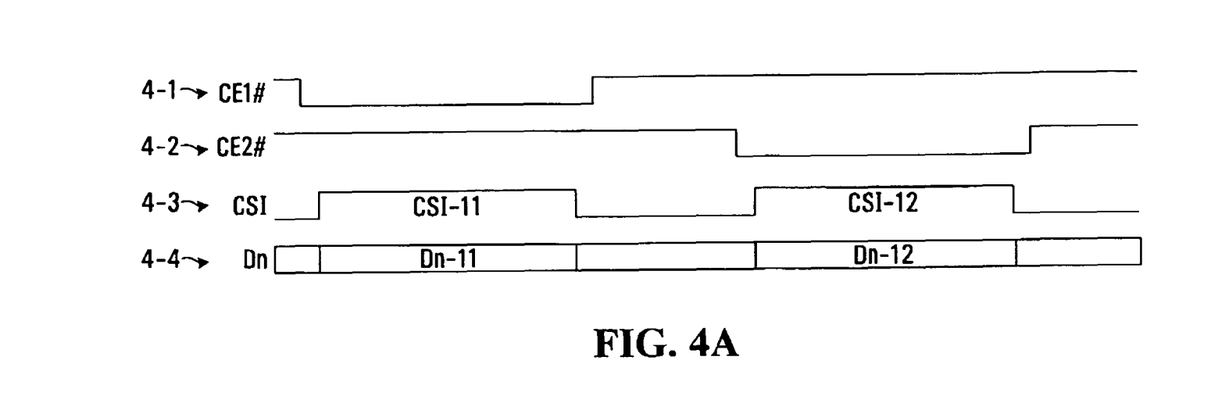
FIGS. 4A and 4B are example timing diagrams for a data transfer in the memory system shown in FIG. 3.

Referring to FIGS. 3 and 4A, the flash memory controller 61 sends a chip enable signal (CE1#) as indicated at 4-1 to the first memory device 64 to enable it. Also, the flash memory controller 61 sends another chip enable signal (CE2#) as indicated at 4-2 to the second memory device 67 to enable it. While the CE1# is "low" and the CE2# is "high", only the first memory device 64 is enabled, so that the first memory device 64 is designated. Then, a command strobe input (CSI) as indicated at 4-3 is asserted (as indicated by CSI-11), and a data input (Dn) as indicated at 4-4 transfers from the data storage elements 63 of the flash memory controller 61 to the page buffer 66 of the first memory device 64 via the common bus 70. The data input Dn contains burst data load, column address and data (as indicated by Dn-11). While the CE1# is "high" and the CE2# is "low", only the second memory device 67 is enabled, so that the second memory device 67 is designated. Then, the CSI is asserted (as indicated by CSI-12), the Dn transfers from the data storage elements 63 of the flash memory controller 61 to the page buffer 69 of the second memory device 67 via the common bus 70. The data input Dn contains burst data load, column address and data (as indicated by Dn-12).

Figure 4B:
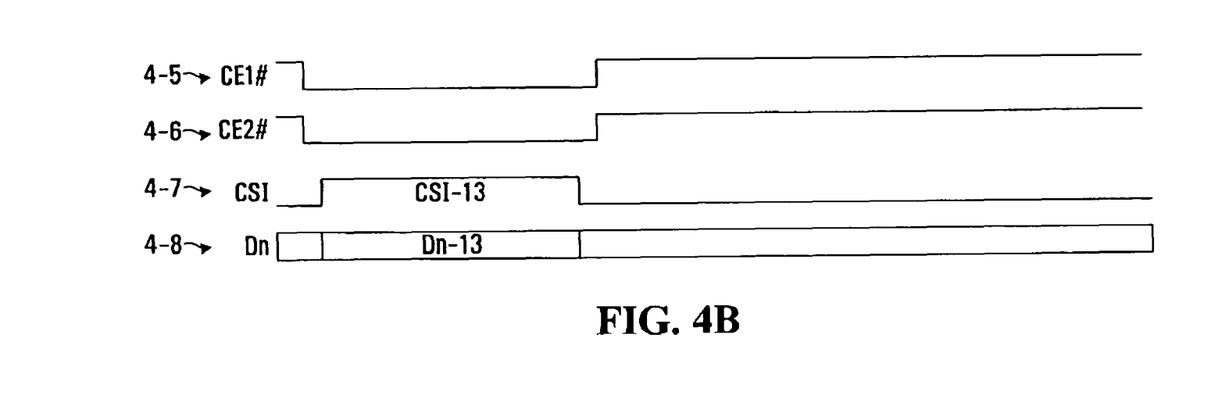

Referring to FIGS. 3 and 4B, the flash memory controller 61 sends the CE1# as indicated at 4-5 and CE2# as indicated at 4-6 to the first and second memory devices 64 and 67, respectively. When the CE1# and CE2# are "low" at the same time, the first and second memory devices 64 and 67 are simultaneously enabled. Then, the CSI as indicated at 4-7 is asserted (as indicated by CSI-13), and the data input (Dn) as indicated at 4-8 transfers from the data storage elements 63 of the flash memory controller 61 to the page buffers 66 and 69 of the first and second memory devices 64 and 67 simultaneously via the common bus 70 (as indicated by Dn-13).

Alternatively, the memory system having a multi-drop architecture shown in FIG. 3 can include more than two memory devices (N>2). In such a memory system, each memory device receives a chip enable signal in different timing. The memory device that receives a chip enable that is "low" is the designated memory device. In response to the command strobe input, data is transmitted to the designated memory device.

In another implementation including more than two memory devices (N>2), the chip enable with a "low" state is sent to all memory devices to enable them simultaneously. Thus, all memory devices are simultaneously designated. In response to the command strobe input, data is transmitted to all memory devices.

Figure 5:
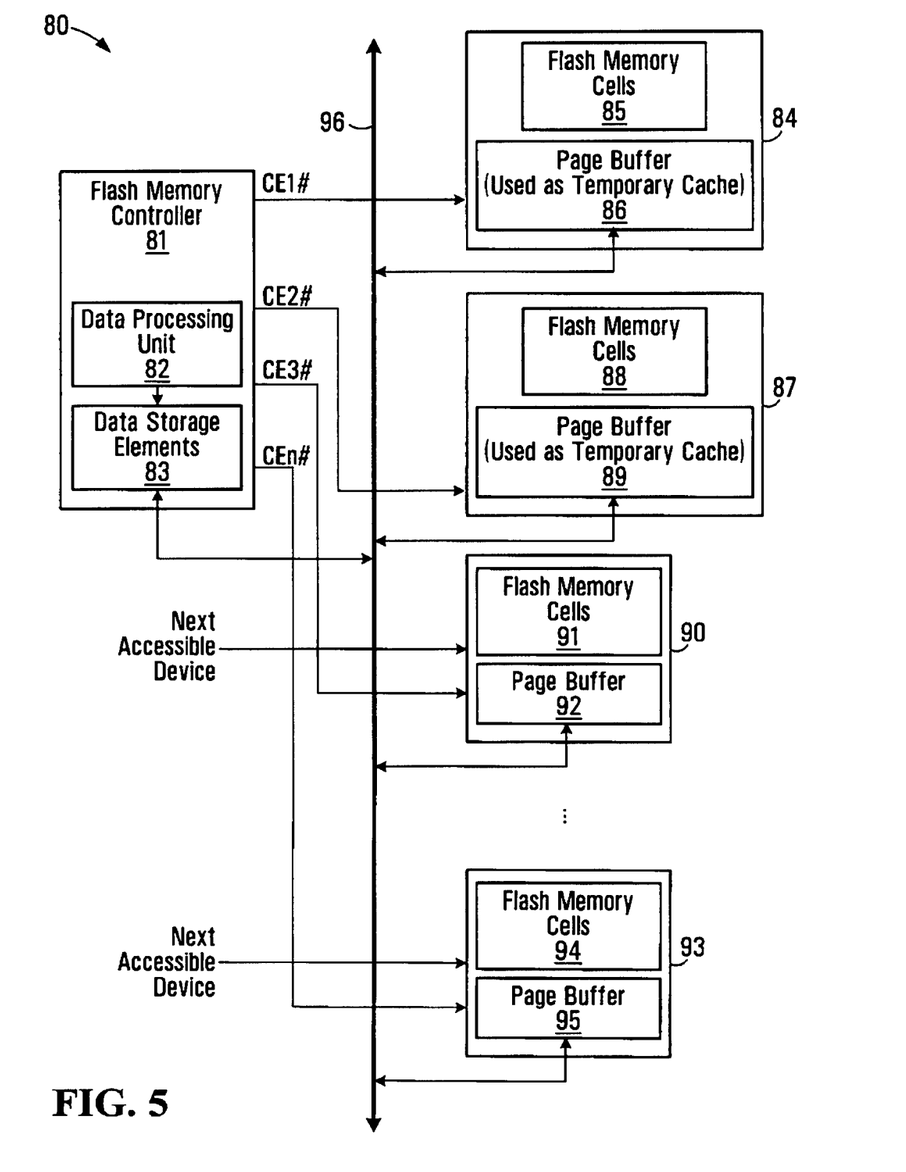
FIG. 5 is a block diagram of a memory system having a multi-drop architecture in which memory devices are accessible after the data transfer.

FIG. 5 shows another example of a memory system 80 having a multi-drop architecture. Referring to FIG. 5, the memory system 80 having a multi-drop architecture includes a flash memory controller 81 and a plurality (n) of memory devices 84, 87, 90, - - - , and 93. The flash memory controller 81 has a data processing unit 82 and data storage elements 83. The memory devices 84, 87, 90, - - - , and 93 have flash memory cells 85, 88, 91, - - - , and 94, respectively, and page buffers 86, 89, 92, - - - , and 95, respectively. The flash memory controller 81 interconnects with the memory devices 84, 87, 90, - - - , and 93 via a common bus 96.

In the example illustrated in FIG. 5, it is assumed that the page buffers 86 and 89 of the two memory devices 84 and 87 are being used as temporary caches 86 and 89 for data. Because of this, these memory devices 84 and 87 are "inaccessible". This is because for either a read or write operation, the page buffers 86 and 89 will be needed, but for now they are not available. The other memory devices 90, - - - , and 93 are considered "accessible" devices because the page buffers 92, - - - , and 95 of the memory devices 90, - - - , and 93 are not currently being used as temporary caches. Therefore, read or write operations or other temporary caching operations to the memory devices 90, - - - , and 93 can be performed. The contents of the temporary caches (the page buffers 86 and 89) can be changed at any time, or modified in part or in whole depending on the flash memory controller 81. If the temporary caches by the page buffers 86 and 89 are unnecessary, then they can be used as page buffers like the other page buffers 92, - - - , and 95.

Figure 6:
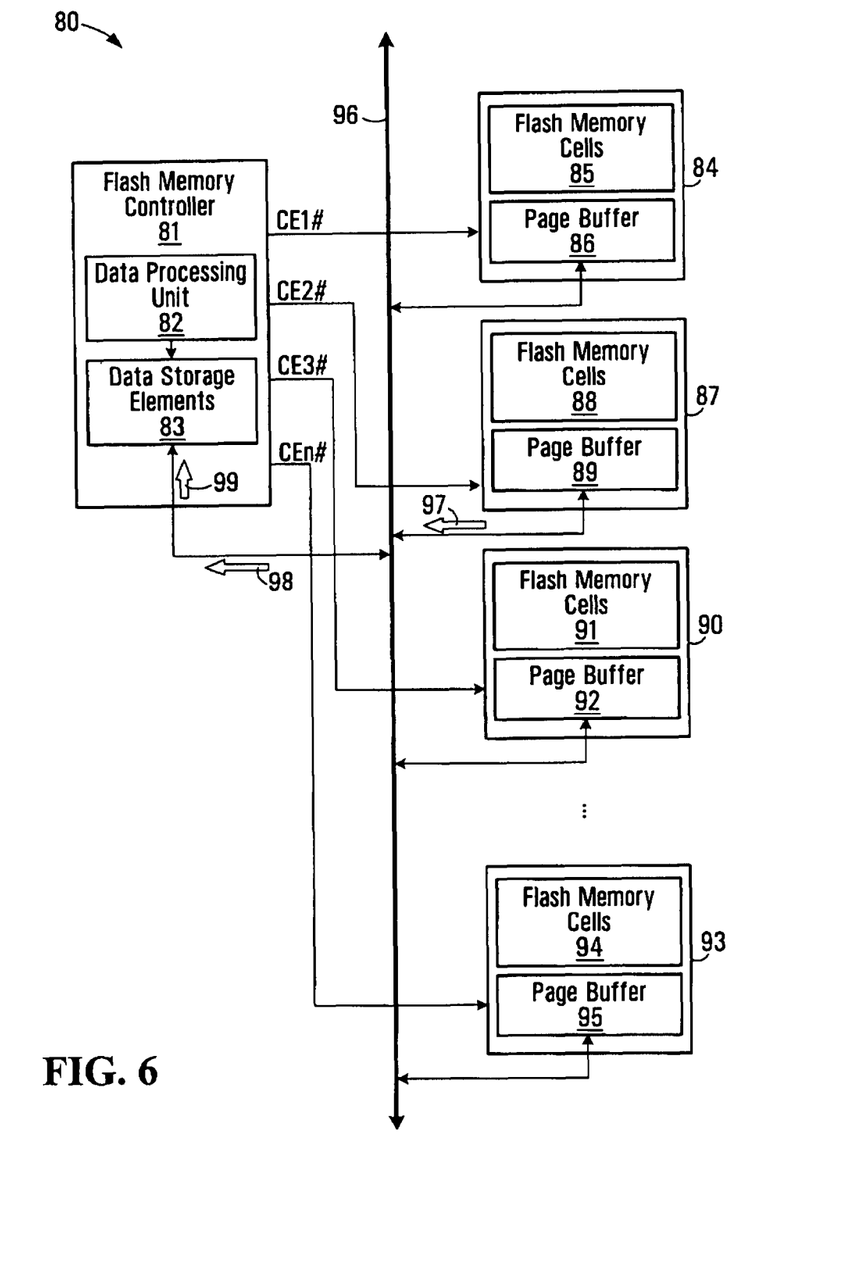
FIG. 6 is a block diagram of the memory system of FIG. 5 in which a data recovery from a temporary cache is performed.

FIG. 6 shows the data recovery from the temporary cache of the memory system 80 shown in FIG. 5. In the particular example shown in FIG. 6, the data is read from the temporary cache 89 of the second memory device 87 to the data storage elements 83 of the flash memory controller 81. A data recovery path includes data paths as indicated at 97, 98 and 99. The data is read out using the command "Burst Data Read ('2Xh')". The flash memory controller 81 sends chip enable (CE1#, CE2#, CE3#, - - - , and CEn#) to the memory devices 84, 87, 90, - - - , and 93, respectively, to enable them. The data recovery from the temporary cache in the memory system 80 is shown in FIG. 7.

Figure 7:
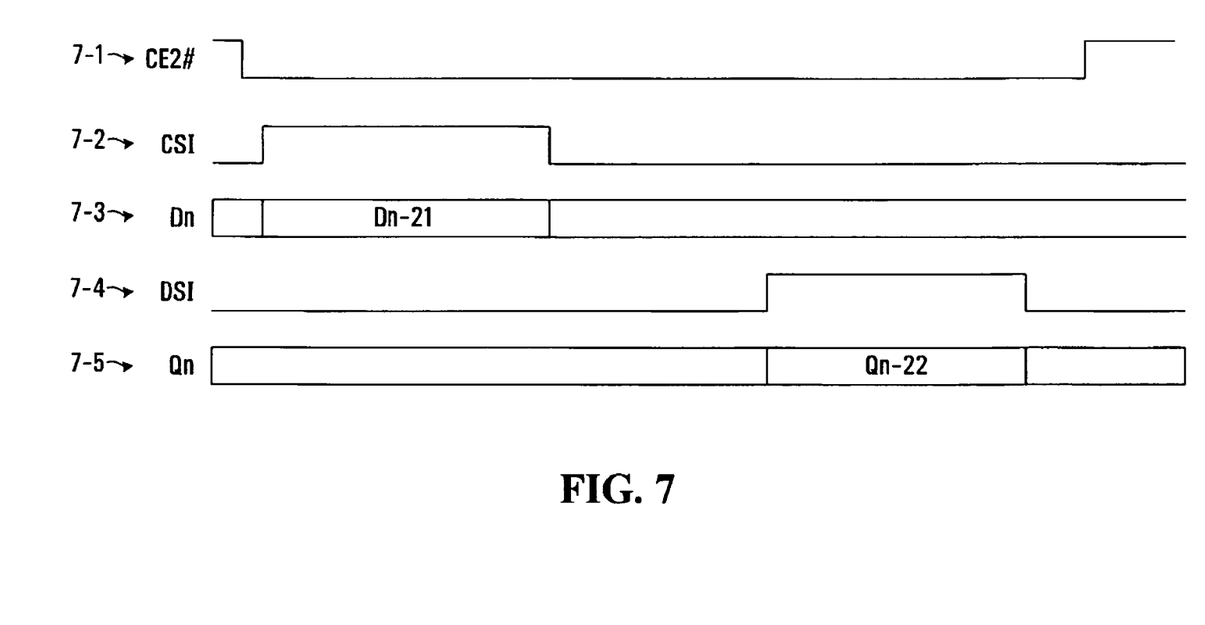
FIG. 7 is an example timing diagram for the data recovery from the temporary cache in the memory system shown in FIG. 6.

Referring to FIGS. 6 and 7, while the CE2# is "low" as indicated at 7-1, a command strobe input (CSI) is "high" as indicated at 7-2, so that the Dn containing burst data read and column address (as indicated by Dn-21) is transferred from the data storage 83 of the flash memory controller 81 as indicated at 7-3. Thereafter, a data strobe input (DSI) is "high" as indicated at 7-4, so that data Qn containing data output from the temporary cache (as indicated by Qn-22) is read from the memory device 87 and transmitted to the data storage elements 83 of the flash memory controller 81 as indicated at 7-5.

Figure 8:
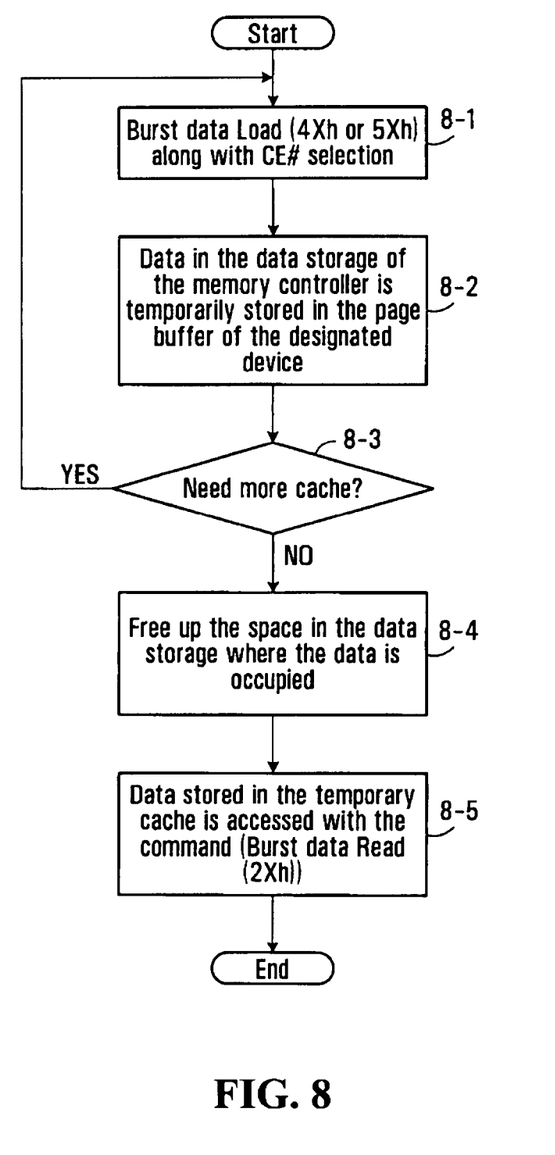
FIG. 8 is a flowchart of an example method for using a page buffer as a temporary cache in the multi-drop architecture.

FIG. 8 shows an example method of using a page buffer as a temporary cache in a multi-drop architecture. This method can be implemented in a memory controller, for example by the memory controller 81 shown in FIGS. 5 and 6.

Referring to FIGS. 5 and 8, the flash memory controller 81 issues the command "Burst Data Load ('4Xh' or '5Xh')" with data and controls the CE# selection for enabling a selected memory device, for example, the second memory device 87 (step 8-1). The data stored in the data storage elements 83 of the flash memory controller 81 is written to the page buffer 89 of the selected memory device 87 (step 8-2). If more cache is needed (YES at step 8-3), then processing of steps 8-1 and 8-2 continues, so that more data can be loaded into the page buffers of the other memory devices. However, if no more cache is needed (NO at step 8-3), then the flash memory controller 81 frees up the space in the data storage elements 83 where the data is occupied (step 8-4). The freed up space can be used for other applications. Then, the flash memory controller 81 can access the data stored in the temporary cache (e.g., the page buffer 89 of the second memory device 87) using the command "Burst Data Read ('2Xh')", so that the temporarily stored data is read back to the data storage elements 83 of the flash memory controller 81 (step 8-5).

In some embodiments of the present invention, the memory systems described herein are implemented using a flexible modular command structure, example details of which have already been provided in Table 1. It is to be understood that the details provided in this section are very specific for example purposes only.

As described above, modular commands (for, e.g., NAND flash memory) can provide higher flexibility of utilizing multiple devices and/or multiple bank accesses than conventional NAND flash memory. Along with this, there is provided diverse utilization of a page buffer of each flash memory on a system. Therefore, if a system uses the modular command NAND flash system in accordance with an embodiment of the invention, the utilization range of a page buffer can be expanded to cache operations between non-volatile flash memories and/or flash memory controller and device.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration of devices and apparatus, the elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for use in a memory system comprising a flash memory controller for communicating with a plurality of memory devices in a multi-drop architecture, the flash memory controller comprising a data storage, each of the plurality of memory devices comprising a page buffer and flash memory cells, the method comprising:
   a) the flash memory controller outputting a command, an enable signal for designating one of the plurality of memory devices, and data from the data storage of the flash memory controller, the command instructing the designated memory device to temporarily store the outputted data in the page buffer of the selected device;
   b) in response to the command and the enable signal, the designated memory device temporarily storing the outputted data in the page buffer of the designated device; and
   repeating a) and b) to store further data from the data storage until no more temporary storage for data is needed,
   wherein repeating a) and b) comprises repeating a) and b) to store data from the data storage to the page buffer of at least one further designated memory device until no more temporary storage for data is needed such that the page buffers of the designated memory devices collectively function as a cache.

2. The method of claim 1 further comprising:
   when no more temporary storage for data is needed, freeing up space in the data storage containing the data that is now also stored in the page buffers of the designated devices.

3. The method of claim 1 further comprising:
   to access the data temporarily stored in the page buffers of the designated memory devices, for each of the designated memory devices in sequence, the flash memory controller outputting a respective command and a respective enable signal that designates the designated memory device, the command instructing the designated memory device to read data from the page buffer of the designated memory device and pass this to the memory controller.

4. The method of claim 3 further comprising:
   the flash memory controller storing the accessed data to the data storage of the flash memory controller.

5. The method of claim 1 wherein:
   the flash memory controller outputting the command and the enable signal comprises sending the enable signal on a dedicated connection to the designated memory device.

6. A method for use in a memory system comprising a flash memory controller for communicating with a plurality of memory devices in a multi-drop architecture, the flash memory controller comprising a data storage, each of the plurality of memory devices comprising a page buffer and flash memory cells, the method comprising:
   a) the flash memory controller outputting a command, an enable signal for designating one of the plurality of memory devices, and data from the data storage of the flash memory controller, the command instructing the designated memory device to temporarily store the outputted data in the page buffer of the selected device;
   b) in response to the command and the enable signal, the designated memory device temporarily storing the outputted data in the page buffer of the designated device; and repeating a) and b) to store further data from the data storage until no more temporary storage for data is needed, the method further comprising:

to access the data temporarily stored in the page buffer of the designated memory device, the flash memory controller outputting a command and an enable signal that designates the designated memory device, the command instructing the designated memory device to read data from the page buffer of the designated memory device and pass this to the memory controller.

7. The method of claim 6 wherein each command that instructs one of the designated memory devices to read data from the page buffer of the designated memory device and pass this to the memory controller contains an operation code that is distinct from an operation code used to read data from the flash memory cells of a designated memory device.

8. The method of claim 7 wherein the operation code is for a burst data read.

9. The method of claim 6 further comprising:

the flash memory controller storing the accessed data to the data storage of the flash memory controller.

10. The method of claim 6 wherein:

the flash memory controller outputting the command and the enable signal comprises sending the enable signal on a dedicated connection to the designated memory device.

11. A method for use in a memory system comprising a flash memory controller for communicating with a plurality of memory devices in a multi-drop architecture, the flash memory controller comprising a data storage, each of the plurality of memory devices comprising a page buffer and flash memory cells, the method comprising:

a) the flash memory controller outputting a command, an enable signal for designating one of the plurality of memory devices, and data from the data storage of the flash memory controller, the command instructing the designated memory device to temporarily store the outputted data in the page buffer of the selected device;

b) in response to the command and the enable signal, the designated memory device temporarily storing the outputted data in the page buffer of the designated device; and repeating a) and b) to store further data from the data storage until no more temporary storage for data is needed, wherein the command that instructs the designated memory device to temporarily store the outputted data contained in the page buffer of the designated device contains an operation code that is distinct from an operation code of a command used to store data in the flash memory cells of a designated memory device.

12. The method of claim 11 wherein the operation code is for a burst data load.

13. The method of claim 11 wherein:

the flash memory controller outputting the command and the enable signal comprises sending the enable signal on a dedicated connection to the designated memory device.

14. A memory system comprising:

a plurality of memory devices each comprising a page buffer and flash memory cells;

a flash memory controller connected to the plurality of memory devices in a multi-drop architecture, the flash memory controller comprising a data storage;

the memory system configured to use at least one page buffer as a cache by:

a) the flash memory controller outputting a command and an enable signal for designating one of the plurality of designated memory devices, and data from the data storage of the memory controller, the command instructing the designated memory device to temporarily store the outputted data in the page buffer of the designated device;

b) in response to the command and the enable signal, the designated memory device temporarily storing the outputted data in the page buffer of the designated device; and repeating a) and b) to store further data from the data storage until no more temporary storage for data is needed, wherein repeating a) and b) comprises repeating a) and b) to store data from the data storage to the page buffer of at least one further designated memory device until no more temporary storage for data is needed such that the page buffers of the designated memory devices collectively function as a cache.

15. The memory system of claim 14 further configured to:

when no more temporary storage for data is needed, free up space in the data storage containing the data that is now also stored in the page buffers of the designated devices.

16. The memory system of claim 14 further configured:

to access the data temporarily stored in the page buffers of the designated memory devices, for each of the designated memory devices in sequence, the flash memory controller outputting a respective command and a respective enable signal that enables the designated memory device, the command instructing the designated memory device to read data from the page buffer of the designated memory device and pass this to the memory controller.

17. The memory system of claim 16 wherein the flash memory controller is further configured to store the accessed data to the data storage of the flash memory controller.

18. The memory system of claim 16 wherein the flash memory controller is further configured to store the accessed data to the data storage of the flash memory controller.

19. The memory system of claim 14 wherein:

the flash memory controller outputting the command and the enable signal comprises sending the enable signal on a dedicated connection to the designated memory device.

20. The memory system of claim 14 further comprising:

for each memory device, a dedicated connection from the memory controller to the memory device for sending a signal to enable the memory device.

21. A memory system comprising:

a plurality of memory devices each comprising a page buffer and flash memory cells;

a flash memory controller connected to the plurality of memory devices in a multi-drop architecture, the flash memory controller comprising a data storage;

the memory system configured to use at least one page buffer as a cache by:

a) the flash memory controller outputting a command and an enable signal for designating one of the plurality of designated memory devices, and data from the data storage of the memory controller, the command instructing the designated memory device to temporarily store the outputted data in the page buffer of the designated device;

b) in response to the command and the enable signal, the designated memory device temporarily storing the outputted data in the page buffer of the designated device; and repeating a) and b) to store further data from the data storage until no more temporary storage for data is needed, the memory system further configured:

to access the data temporarily stored in the page buffer of the designated memory device, the flash memory controller outputting a command and an enable signal that enables the designated memory device, the command instructing the designated memory device to read data from the page buffer of the designated memory device and pass this to the memory controller.

22. The memory system of claim 21 each command that instructs one of the designated memory devices to read data from the page buffer of the designated memory device and pass this to the memory controller contains an operation code that is distinct from an operation code used to read data from the flash memory cells of a designated memory device.

23. The memory system of claim 22 wherein the operation code is for a burst data read.

24. The memory system of claim 21 wherein the flash memory controller is further configured to store the accessed data to the data storage of the flash memory controller.

25. The memory system of claim 21 wherein the flash memory controller is further configured to store the accessed data to the data storage of the flash memory controller.

26. The memory system of claim 21 wherein:

the flash memory controller outputting the command and the enable signal comprises sending the enable signal on a dedicated connection to the designated memory device.

27. A memory system comprising:

a plurality of memory devices each comprising a page buffer and flash memory cells;

a flash memory controller connected to the plurality of memory devices in a multi-drop architecture, the flash memory controller comprising a data storage;

the memory system configured to use at least one page buffer as a cache by:

a) the flash memory controller outputting a command and an enable signal for designating one of the plurality of designated memory devices, and data from the data storage of the memory controller, the command instructing the designated memory device to temporarily store the outputted data in the page buffer of the designated device;

b) in response to the command and the enable signal, the designated memory device temporarily storing the outputted data in the page buffer of the designated device; and repeating a) and b) to store further data from the data storage until no more temporary storage for data is needed, wherein the command that instructs the designated memory device to temporarily store the outputted data in the page buffer of the designated device contains an operation code that is distinct from an operation code of a command used to store data in the flash memory cells of a designated memory device.

28. The memory system of claim 27 wherein the operation code is for a burst data load.

29. The memory system of claim 27 wherein:

the flash memory controller outputting the command and the enable signal comprises sending the enable signal on a dedicated connection to the designated memory device.

* * * * *